United States Patent
Torrini et al.

(10) Patent No.: US 11,802,894 B2
(45) Date of Patent: Oct. 31, 2023

(54) COMPRESSING INFORMATION IN AN END NODE USING AN AUTOENCODER NEURAL NETWORK

(71) Applicant: Silicon Laboratories Inc., Austin, TX (US)

(72) Inventors: Antonio Torrini, Austin, TX (US); Javier Elenes, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/023,654

(22) Filed: Sep. 17, 2020

(65) Prior Publication Data
US 2022/0082598 A1   Mar. 17, 2022

(51) Int. Cl.
*G01R 23/16* (2006.01)
*G06N 3/02* (2006.01)

(52) U.S. Cl.
CPC .............. *G01R 23/16* (2013.01); *G06N 3/02* (2013.01)

(58) Field of Classification Search
CPC ........... G01R 23/16; G06N 3/02; G10L 15/30
See application file for complete search history.

(56) References Cited

U.S. PATENT DOCUMENTS

| | | | |
|---|---|---|---|
| 2016/0027445 A1* | 1/2016 | Vasilache | H04S 1/007 381/23 |
| 2019/0272840 A1* | 9/2019 | Caroselli | G06N 3/02 |
| 2021/0012769 A1* | 1/2021 | Vasconcelos | G10L 15/02 |
| 2021/0082441 A1* | 3/2021 | Li | G10L 19/008 |
| 2021/0183387 A1* | 6/2021 | Rajan | G06F 3/167 |
| 2021/0277564 A1* | 9/2021 | Mashal | D06F 33/44 |
| 2021/0295147 A1* | 9/2021 | Kelly | G06F 18/24137 |

OTHER PUBLICATIONS

Stanford EDU, Unsupervised Feature Learning and Deep Learning Tutorial, "Autoencoders," Aug. 9, 2020, 5 pages total, ufldl.stanford.edu/tutorial/unsupervised/Autoencoders.
Wikipedia, "Autoencoder," Aug. 9, 2020, 13 pages total.
U.S. Appl. No. 16/916,202, filed Jun. 30, 2020, entitled "Scaling Traffic in a User Aware Wireless Control Network," by Peter Shorty, et al.

* cited by examiner

*Primary Examiner* — Manuel L Barbee
(74) *Attorney, Agent, or Firm* — Trop, Pruner & Hu, P.C.

(57) ABSTRACT

In one embodiment, an apparatus includes: a sensor to sense real world information; a digitizer coupled to the sensor to digitize the real world information into digitized information; a signal processor coupled to the digitizer to process the digitized information into a spectrogram; a neural engine coupled to the signal processor, the neural engine comprising an autoencoder to compress the spectrogram into a compressed spectrogram; and a wireless circuit coupled to the neural engine to send the compressed spectrogram to a remote destination, to enable the remote destination to process the compressed spectrogram.

18 Claims, 6 Drawing Sheets

COMPRESSING INFORMATION IN AN END NODE USING AN AUTOENCODER NEURAL NETWORK

BACKGROUND

It is common for end node devices to sense and collect data about their environment. For example such data can be audio or images. It is often prohibitive for the end node to perform meaningful computations on such data, for example, speech recognition to detect a keyword or detecting presence of a person in an image. Therefore end nodes typically transmit raw data to the cloud, where it is processed using powerful machine learning algorithms. However transmission of raw data requires bandwidth and power consumption that may be prohibitively large for a battery-powered device or other power-constrained device.

SUMMARY OF THE INVENTION

In one aspect, an apparatus includes: a sensor to sense real world information; a digitizer coupled to the sensor to digitize the real world information into digitized information; a signal processor coupled to the digitizer to process the digitized information into a spectrogram; a neural engine coupled to the signal processor, the neural engine comprising an autoencoder to compress the spectrogram into a compressed spectrogram; and a wireless circuit coupled to the neural engine to send the compressed spectrogram to a remote destination, to enable the remote destination to process the compressed spectrogram.

In an example, the neural engine is to store a model for the autoencoder. The model may comprise a structure of a neural network and a plurality of coefficients, and may be a pre-trained model generated using at least one correlation function according to a type of the real world information. The apparatus may receive an updated model from the remote destination and update at least some of the plurality of coefficient weights of the model based on the updated model. A decoder of the autoencoder may decompress a first compressed spectrogram into a first reconstructed spectrogram, the first compressed spectrogram compressed by an encoder of the autoencoder from a first spectrogram.

In an example, the apparatus may compare the first spectrogram to the first reconstructed spectrogram and send the first spectrogram to the remote destination instead of the first compressed spectrogram based at least in part on the comparison. The apparatus may compare the first spectrogram to the first reconstructed spectrogram in response to a request from the remote destination.

In an example, the real world information comprises speech information, the apparatus comprising a voice-controlled end node device. The voice-controlled end node device may receive from the remote destination at least one command based at least in part on the compressed spectrogram. The real world information may be image information, and the apparatus may take an action in response to a command from the remote destination based on detection at the remote destination of a person in the image information, based at least in part on the image information.

In another aspect, a method comprises: generating an autoencoder comprising an encoder and a decoder, and generating a classifier, where the encoder is to encode a spectrogram into a compressed spectrogram, the decoder is to decode the compressed spectrogram into a recovered spectrogram, and the classifier is to determine at least one keyword from the decoded compressed spectrogram; calculating a first loss of the autoencoder and calculating a second loss of the classifier; jointly training the autoencoder and the classifier based at least in part on the first loss and the second loss; and storing the trained autoencoder and the trained classifier in a non-transitory storage medium.

In an example, the method further comprises jointly training the autoencoder and the classifier based on a weighted sum of the first loss and the second loss. The method may further comprise: calculating the first loss according to a correlation coefficient; and calculating the second loss according to a binary cross-entropy. The method may further comprise sending a trained encoder portion of the autoencoder to one or more end node devices to enable the one or more end node devices to compress spectrograms using the trained encoder portion. The method may further comprise generating the encoder asymmetrically from the decoder.

In yet another aspect, a voice-controlled device may include: a microphone to receive a speech input; a digitizer coupled to the microphone to digitize the speech input into digitized information; a signal processor coupled to the digitizer to generate a spectrogram from the digitized information; a controller coupled to the signal processor, the controller comprising an encoder of an autoencoder to compress the spectrogram into a compressed spectrogram corresponding to the speech input; and a wireless circuit coupled to the controller to send the compressed spectrogram to a remote server to enable the remote server to process the compressed spectrogram. In response to a command from the remote server, the controller may cause the wireless circuit to send to the remote server an uncompressed spectrogram corresponding to another speech input.

In an example, the controller further comprises a decoder of the autoencoder to decompress one or more compressed spectrograms compressed by the encoder of the autoencoder into one or more reconstructed spectrograms. The controller may receive at least one second command from the remote server and effect a user-requested operation in response to the at least one second command, where the speech input comprises the user-requested operation. The voice-controlled device may further comprise a buffer to store a model for the encoder. The model may include a structure of a neural network and a plurality of coefficient weights, where the model comprises a pre-trained model generated using at least one correlation function for the spectrogram.

In an example, the voice-controlled device may further comprise a second buffer to store a second model for the encoder, where the second model comprises a structure of a second neural network and a plurality of second coefficient weights. The second model may be a pre-trained model generated using at least one correlation function for an image input. The encoder may be asymmetric from a decoder of the autoencoder, the decoder present at the remote server to decompress the compressed spectrogram, and the decoder may have larger kernels and more filters than the encoder or a different architecture.

DETAILED DESCRIPTION

Figure 1:
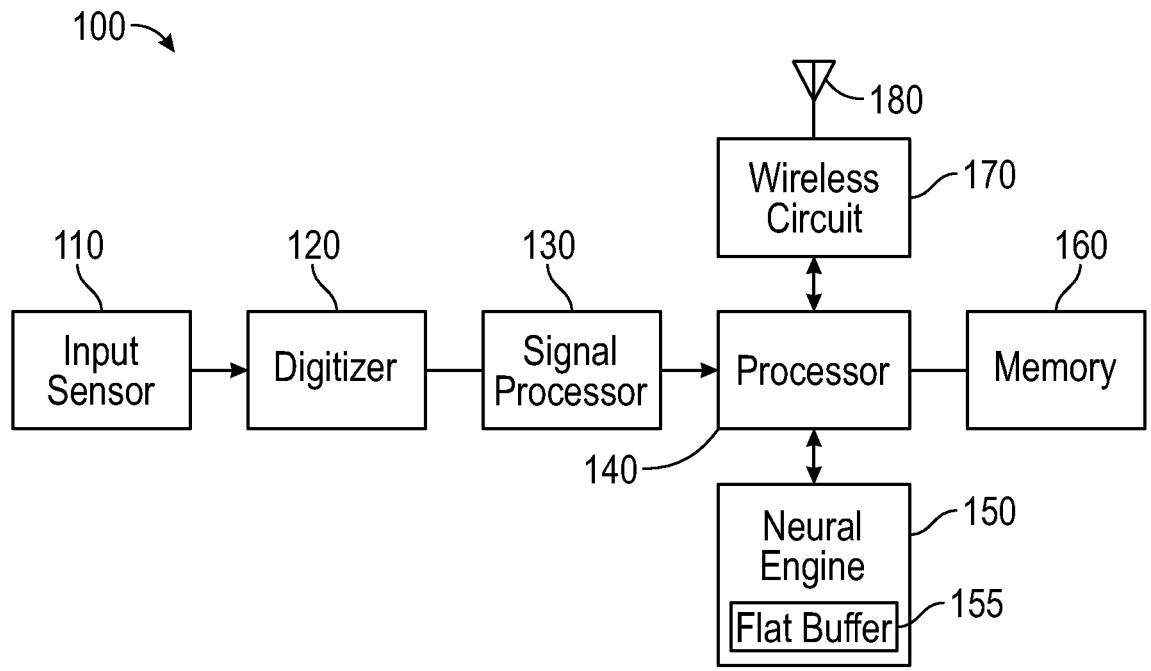
FIG. 1 is a block diagram of an end node device in accordance with an embodiment.

In various embodiments, an end node device may be configured to sense real world information, such as speech data, image data or so forth. In turn, the end node device may minimally process the sensed information, before sending the information to a remote entity such as a cloud-based destination that further processes the data.

As the end node device typically has limited processing and power resources (e.g., the end node device may be a battery-operated device), more complex processing may be performed at the cloud-based destination. While embodiments may vary, implementations described herein may be in the context of voice-controlled end node devices such as remote controls, home automation components such as lighting, security, HVAC components, among other device types. For such voice-controlled devices, the sensed input may be speech, where the device may be configured to wake responsive to a keyword. After waking, the device may sense a speech string and encode the speech into one or a sequence of spectrograms. Thereafter, the device, using a trained autoencoder, may compress the spectrogram(s) into a compressed spectrogram (or sequence of compressed spectrograms) format, which is then sent to a cloud-based destination.

In many cases, this end node device is a wireless-enabled device, such that communication to a remote source such as the cloud-based destination may occur via a wireless local area network (WLAN), e.g., according to a given IEEE 802.11 standard, that in turn couples, e.g., through a gateway to the cloud-based destination via a network such as the Internet.

While in some cases it is possible that the device itself may train the autoencoder using machine learning techniques, more typically due to the limited compute and power capabilities of the device, the autoencoder may be pre-trained and loaded into the end node device. In situations where the intended use of this end node device is known, the autoencoder may be pre-loaded into the end node device, e.g., into a non-transitory storage medium of the device, during manufacture. Note that in such instances it is further possible for the autoencoder to be updated in the field in response to an update to the autoencoder model received from the cloud-based destination.

Further, as this autoencoder is pre-trained for a particular type of input information, in some cases an end node device may be configured with multiple autoencoders, each for processing different information types. For example, a first coding scheme may be used for speech input and a second coding scheme may be used for another input type, e.g., image information. As such, depending on the nature of incoming data, a suitable algorithm may be devised for the autoencoder. Note that a given autoencoder implementation designed for a particular information type may not work optimally for data of a different nature. With an embodiment having one or more autoencoders, efficient compression may be automatically learned for each suitable data set. In some embodiments, the autoencoder may be trained using one or more correlation functions dependent on characteristics of the type of input information. In contrast, typically autoencoders are trained using a mean square error technique.

Referring now to FIG. 1, shown is a block diagram of an end node device in accordance with an embodiment. As shown in FIG. 1, device 100 may be any type of end node device such as an Internet of Things (IoT) device. In some cases, device 100 may be a voice-controlled device such as described above. For certain wake keywords and possibly a small set of other locally handled keywords, device 100 may be configured to fully process and take some action in response thereto. However, in many instances incoming speech may be minimally processed within device 100 and then sent to a remote destination such as a cloud-based destination for further processing and handling.

In the high level shown in FIG. 1, device 100 includes an input sensor 110. Understand that in different implementations multiple sensors may be present, each to sense a different type of real world information such as environmental conditions, image information, speech or other audio information or so forth. Input sensor 110 thus may include one or more microphones and possibly other sensors such as image sensors, video sensors, thermal sensors, accelerometers, passive infrared sensors and so forth.

In turn, input sensor 110 is coupled to a digitizer 120, e.g., an analog-to-digital converter, which digitizes the information and provides it to a signal processor 130, which may perform various signal processing, such as filtering, amplification or so forth. Note that in some implementations, at least some of this signal processing may be performed in an analog domain prior to digitizer 120. In any event, the digitized processed information is provided to a processor 140, which may be a main processor of system of device 100, such as a microcontroller, processing core or other general-purpose processing circuitry or other such controller.

Relevant to the discussion herein, processor 140 may perform additional signal processing on this information, including converting the digitized information into a spectrogram. In turn, processor 140 is coupled to a neural engine 150 which in some cases may be implemented as a dedicated hardware circuit. In different embodiments, neural engine 150 can be implemented with fully connected layers or convolutional neural network layers. Note that in some cases at least two of signal processor 130, processor 140 and neural engine 150 may be implemented together.

In any event, neural engine 150 may compress the spectrogram according to the trained parameters, which may be stored in a flat buffer 155. Such parameters may include a structure of a neural network and a plurality of weight coefficients, in an embodiment. Note that in some implementations, only an encoder portion of the autoencoder is present. In other implementations, both encoder and decoder portions of the autoencoder may be present. Processor 140 may further store, at least temporarily, the uncompressed spectrogram in a memory 160.

To enable remote processing of the sensed information, processor 140 may receive the compressed spectrogram from neural engine 150 and provide it to a wireless circuit 170, which may wirelessly transmit the compressed information via an antenna 180. Understand that antenna 180 also may be configured to receive incoming information, such as command information from the cloud-based destination to enable device 100 to perform some action in response to the command information received. Although shown at this high level in the embodiment of FIG. 1, many variations and alternatives are possible.

Figure 2:
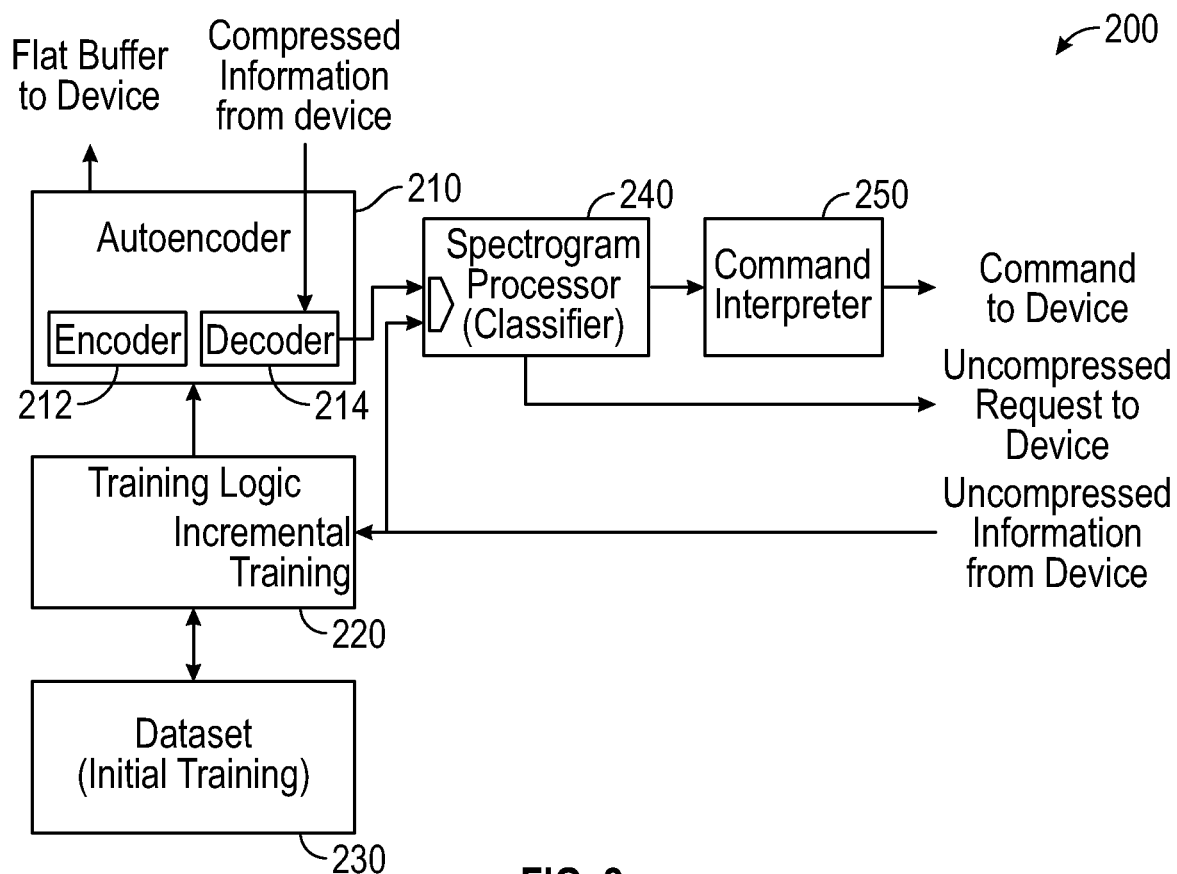
FIG. 2 is a block diagram of a cloud server in accordance with an embodiment.

Referring now to FIG. 2, shown is a block diagram of a cloud server 200, which may be a remote server, e.g., present within a data center. Cloud server 200 may be configured to receive incoming compressed spectrograms from a large number of remotely located end node devices, decompress and process the decompressed information as described herein.

In addition, FIG. 2 shows the components of cloud server 200 involved in initial training of an autoencoder model for a particular type of sensed information. While all of these components are shown in a single cloud server 200 for ease of illustration, understand that in certain cases these components may be present in different servers. And in fact, the initial training (and training updates) as described herein may be performed by different entities on different hardware such as different (e.g., cloud) servers. For example, the pre-training may be performed by an IC or IoT device manufacturer that performs this training to load an autoencoder into devices before they are sold. In other cases, this pre-training may be performed by a system distributor that implements devices into a network architecture such as a home automation network. And the processing of received compressed information from end node devices may be performed by this same entity, some cases.

As illustrated, cloud server 200 includes an autoencoder 210, including an encoder 212 and a decoder 214. In one implementation, autoencoder 210 may be a symmetric autoencoder having 3×3 kernels and 16 filters. However in other cases, encoder 212 may be asymmetric with respect to decoder 214, such that a simpler, less compute-intensive encoder is provided, as encoding typically will be performed in end node devices. In an example embodiment, the asymmetric autoencoder may include 2× filters, 5×5 inner kernels and 7×7 output kernels. As another example, the asymmetric autoencoder may include 4× filters, 7×7 inner kernels and 11×11 output kernels. In some embodiments, autoencoder 210 may perform compression with a compression ratio of up to approximately 16× with low reconstruction loss (although higher compression ratios may be possible if some amount reconstruction loss is permitted). As such, better compression ratios can be achieved with a relatively simple (e.g., low cycle count) encoder in the end node device and a more complex (e.g., higher cycle count) decoder in cloud server 200.

As shown, cloud server 200 may send a flat buffer to an end node device that includes a model, of at least, encoder 212. This flat buffer may include a neural network structure and a plurality of coefficient weights to realize encoder 212 of autoencoder 210. In some cases, the flat buffer (or another flat buffer) further may include a structure and coefficient weights for decoder 214, in instances in which a decoder is desired to be provided to an end node device for use in performing local quality checks as described herein.

As further illustrated, autoencoder 210 further receives compressed information, e.g., in the form of compressed spectrograms, from connected end node devices. Such compressed spectrograms are provided to decoder 214, which may decompress them. As shown, decompressed spectrograms are provided to a spectrogram processor 240, which may be implemented as a classifier. This machine learning classifier may process the spectrograms to identify properties of the originally sensed real world information, such as speech information, image information or so forth.

From the classifier, the classified results may be provided to a command interpreter 250, which may interpret these results into one or more commands to be sent back to the end node device. For example, for speech information, keywords identified by the classifier may be used to generate commands for an action to be taken by an end node device. These actions may include playing a particular media file, performing an operation in an automation network or so forth. In the case of image information, the classified result may indicate the presence of a person in the local environment, which may trigger a particular command to be sent by command interpreter 250 such as turning on a light, triggering an alarm or so forth.

Still with reference to FIG. 2, when spectrogram processor 240 has difficulty classifying the received information, e.g., due to poor quality, it may send a request to an end node device for uncompressed information. The end node device may send in response to this request uncompressed information, e.g., various uncompressed spectrograms which may be provided directly to spectrogram processor 240 (as there is no need to perform a decoding in autoencoder 210). Still further, such uncompressed information e.g., in spectrogram form, may be provided to a training logic 220, which may perform incremental training based on such incoming information.

Still regarding FIG. 2, training logic 220 also may perform an initial training of autoencoder 210 using information in a data set 230, which may be various samples of a training data set to enable pre-training to occur. Understand while shown at this high level in the embodiment of FIG. 2, many various alternatives are possible.

Figure 3:
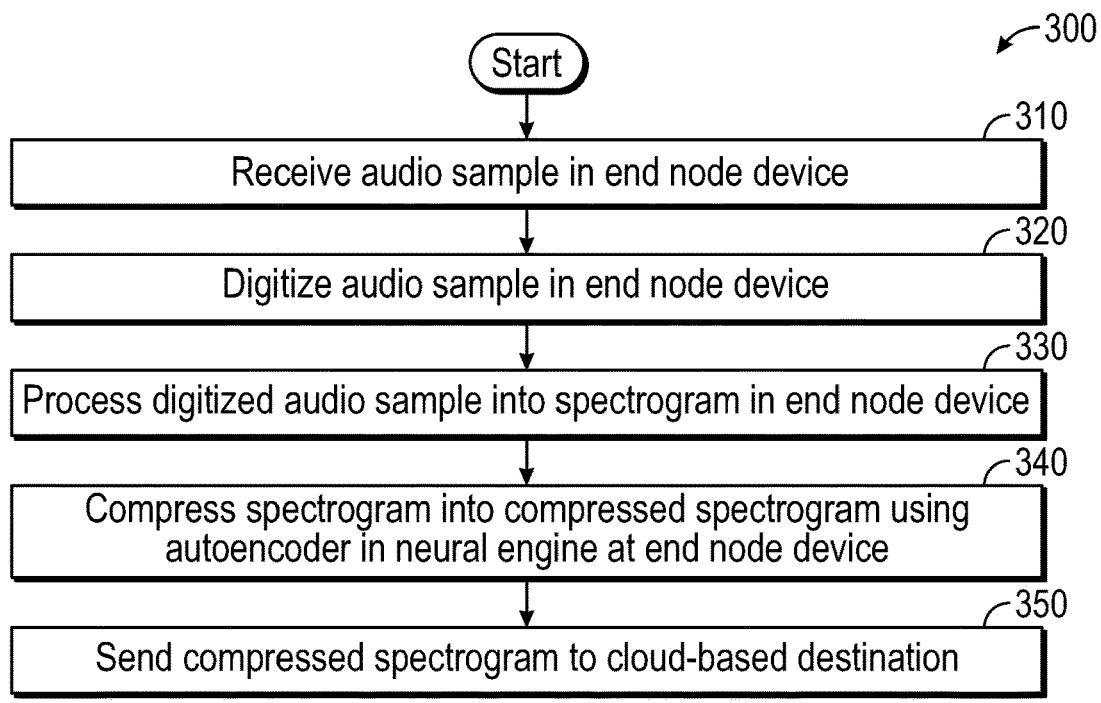
FIG. 3 is a flow diagram of a method in accordance with an embodiment.

Referring now to FIG. 3, shown is a flow diagram of a method in accordance with an embodiment. More specifically, method 300 is a method performed by an end node device to receive incoming real world information, minimally process it, and send it to a remote destination. While for illustration FIG. 3 is in the context of the real world information being audio information, understand embodiments are not limited in this regard and in other implementations, the real world information may be of a wide variety of different information types.

As illustrated, method 300 begins by receiving an audio sample in the end node device (block 310). For example, the end node device may include a microphone or other sensor to detect audio input, such as a user's speech. At block 320 this audio sample may be digitized, e.g., after certain analog front end processing such as filtering, signal conditioning and so forth. Next at block 330 the digitized audio sample may be processed. In embodiments, the sample may be processed into a spectrogram. Of course other digital representations of the audio sample may be generated in other implementations such as may be appropriate for other types of input information. For example, in another case a single fast Fourier transform (FFT) may be used for a time stationary signal.

Still with reference to FIG. 3, control next passes to block 340 where the spectrogram may be compressed. In an embodiment, the spectrogram compression may be performed in a neural engine that may be implemented in a hardware processor of the end node device. More particularly in embodiments herein an autoencoder having a pre-trained model may perform the compression. Thereafter, at block 350 the compressed spectrogram may be sent to a cloud-based destination, e.g., a remote server. This remote server may further process the received audio samples, e.g., to determine various actions to be taken by the end node device in response to the audio samples, e.g., voice commands. Understand while shown at this high level in the embodiment of FIG. 3, many variations and alternatives are possible.

Figure 4:
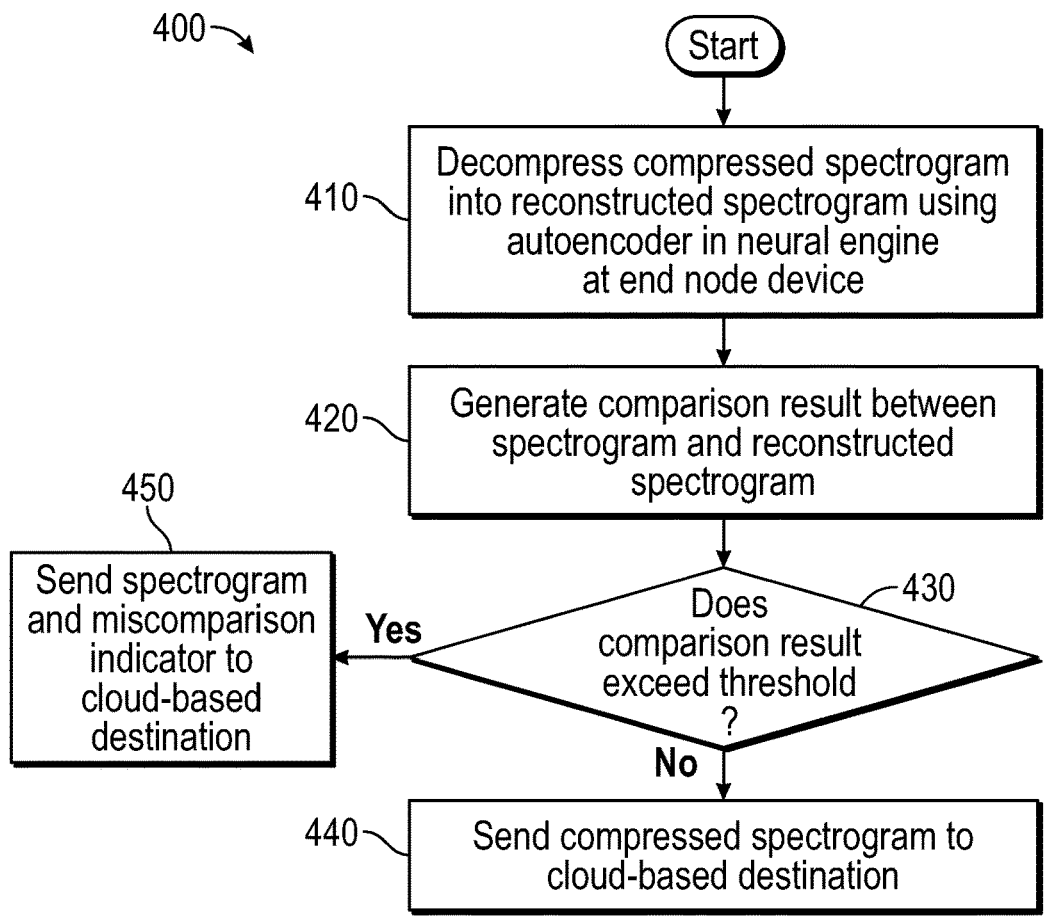
FIG. 4 is a flow diagram of a method in accordance with another embodiment.

Referring now to FIG. 4, shown is a flow diagram of a method in accordance with another embodiment. More specifically, method 400 of FIG. 4 is a method for identifying when it may be inappropriate to send compressed information from an end node device to a destination. Thus method 400 may be performed within the end node device itself. In some cases, method 400 may be performed according to a periodic interval to regularly determine the quality of compressed information being sent from the end node device (where the periodic interval can be controlled to reduce power consumption). In other cases, method 400 may be executed in response to receipt of an indication from the remote destination that incoming compressed information is not of suitable quality.

As illustrated, method 400 begins by decompressing a compressed spectrogram into a reconstructed spectrogram (block 410). In an embodiment, the autoencoder may perform this decompression, e.g., using a pre-trained decoder. Understand that for this operation to occur, the end node device includes a full autoencoder (both encoder and decoder). Next at block 420 the end node device may generate a comparison result between the original spectrogram it generated and this reconstructed spectrogram obtained by decompression of the compressed spectrogram. As an example, some type of difference calculation may be made between these two spectrograms. Next at diamond 430 it is determined whether this comparison result exceeds a threshold. The threshold may take various forms but may be a threshold that measures a level of quality of compression being performed within the end node device.

If this comparison result does not exceed the threshold, the current autoencoder model is appropriate and thus control passes to block 440 where the end node device may continue to send compressed spectrograms to the cloud-based destination. Otherwise when it is determined that the comparison result does exceed the threshold, this indicates that the autoencoder-performed compression is not providing suitable results. Accordingly, at block 450 the full uncompressed spectrogram may be sent to the cloud-based destination. In addition, a comparison indicator or other feedback information may be sent to the cloud-based destination. Note that in response to receipt of this communication, the cloud-based destination may perform an update to the autoencoder model, e.g., by updating the training. At the conclusion of such training update, updated model parameters may be sent to the end node device (and other end node devices), to enable updates to the autoencoder model. Understand while shown at this high level in the embodiment of FIG. 4, many variations and alternatives are possible.

Figure 5:
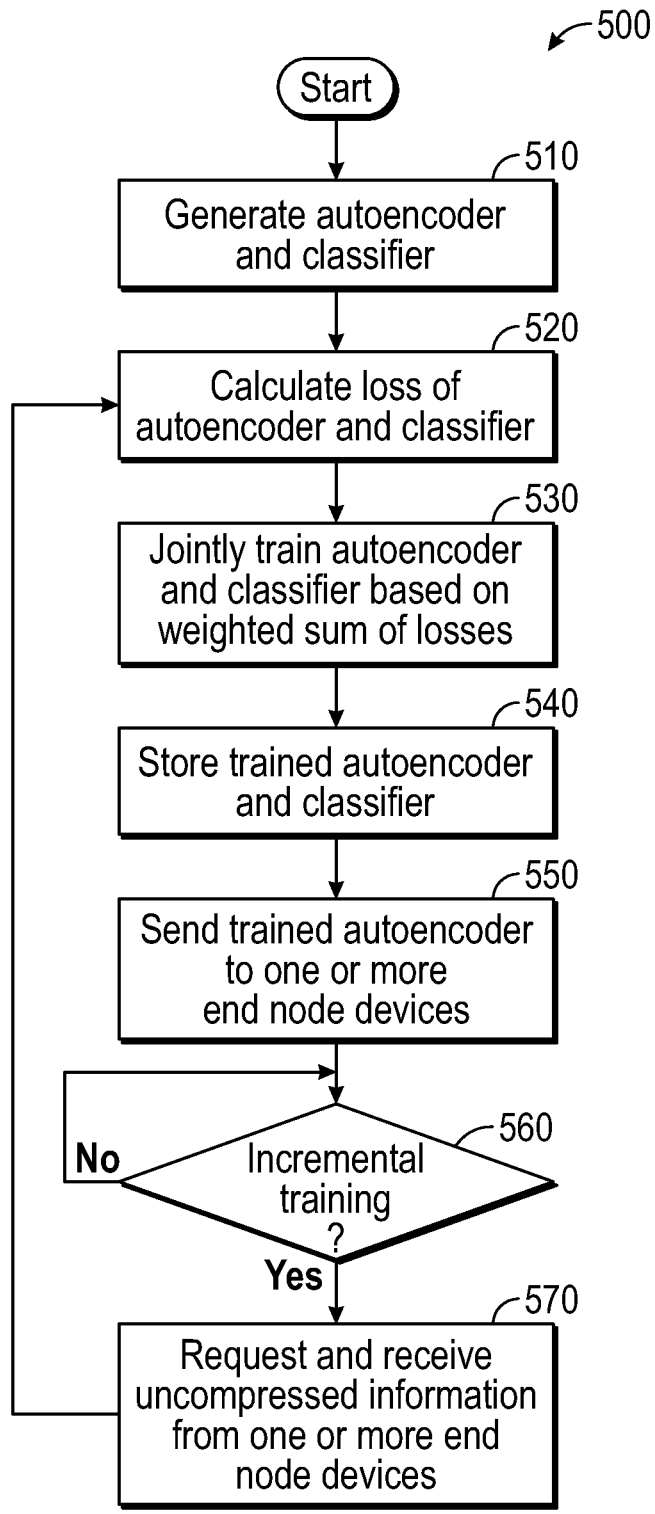
FIG. 5 is a flow diagram of a method in accordance with yet another embodiment.

Referring now to FIG. 5, shown is a flow diagram of a method in accordance with yet another embodiment. Specifically, method 500 is a method for performing training of an autoencoder and classifier as described. In an embodiment, method 500 may be performed by one or more cloud servers or other computing systems. As such, method 500 may be performed by hardware circuitry, firmware, software and/or combinations thereof.

Method 500 begins by generating an autoencoder and a classifier (block 510). Note that generation of autoencoder and classifier may be according to a given model where the autoencoder includes an encoder and a decoder. The encoder and decoder may be symmetric or asymmetric, in different implementations. In turn, the classifier may be generated as a machine learning classifier to classify inputs into corresponding classes of labels. As examples, inputs may be classified into particular keywords, detection of a person within an image, gesture detection, among many other classification problems.

Still with reference to FIG. 5, next at block 520 a loss of the autoencoder and a loss of the classifier may be independently calculated. As examples, the autoencoder loss may be determined as one of: a sum of absolute value of difference between input and output (L1 norm); a sum of difference between input and output, squared (L2 norm); and a correlation between input and output (Pearson correlation). In an embodiment, the classifier loss may be determined as a binary cross-entropy between a predicted class and a true class. In some cases, joint losses (e.g., L2 and cross-entropy) can be determined.

Next at block 530 the autoencoder and the classifier may be jointly trained. This joint training may be performed to minimize a loss function. In an embodiment, the joint training may be based on a weighted sum of the losses. Then at block 540 the trained autoencoder and classifier may be stored, e.g., in one or more non-transitory storage media that may be present in one or more cloud servers.

At this point the models are appropriately trained and can be used to encode and decode information and then to classify the resulting information. To enable cloud-based processing of sensed information from end node devices, at block 550 the trained autoencoder may be sent to one or more such devices. In some cases the full autoencoder including both encoder and decoder can be sent. In other cases, particularly in the context of a reduced complexity IoT device, only the encoder portion of the autoencoder may be sent. At this point, the cloud server may start receiving compressed data, e.g., in the form of compressed spectrograms, from one or more of the devices.

Note that as time progresses, it may be possible to perform an incremental training of one or more of the autoencoder and classifier. As an example, such incremental training may be performed at a predetermined interval. Or, when it is determined that lower quality compressed data is being received from end devices, the classifier may trigger such incremental training. When this incremental training is triggered, control passes from diamond 560 to block 570, where one or more uncompressed spectrograms may be received from one or more end node devices in response to requests from a cloud server. These uncompressed spectrograms may be used to further train the autoencoder and/or classifier. Control passes back to block 520, discussed above, where the incremental training may be performed similarly to the initial training. Understand while shown at this high level in the embodiment of FIG. 5, many variations and alternatives are possible.

Figure 6:
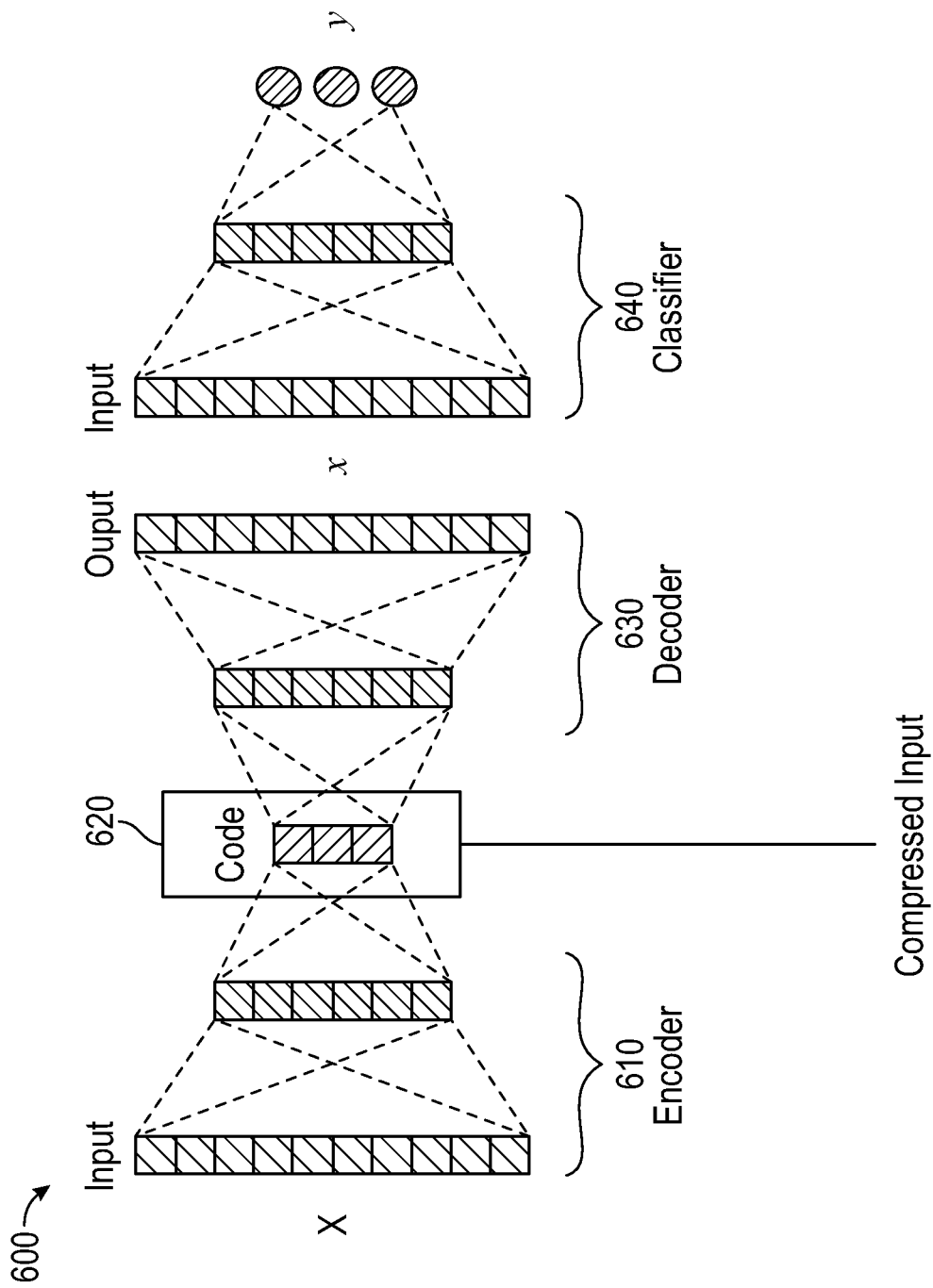
FIG. 6 is a block diagram of a system for performing combined training of an autoencoder and a classifier in accordance with an embodiment.

Referring now to FIG. 6, shown is a block diagram of a system for performing combined training of an autoencoder and a classifier in accordance with an embodiment. As shown in FIG. 6, system 600 may be implemented within a computing device such as a server or so forth. The combined training may occur between an autoencoder formed of an encoder 610 and a decoder 630, and a classifier 640.

FIG. 6 further shows a flow of data through these components. More specifically, an input X, which may be an uncompressed spectrogram, is encoded within encoder 610 to generate a code 620, corresponding to a compressed spectrogram. This compressed spectrogram is provided as an input to decoder 630, which decompresses code 620 to generate a reconstructed uncompressed spectrogram X. In turn, this value is provided as an input to classifier 640, which generates a class label, y, corresponding to a target word Y based on the original spectrogram X.

By performing training within system 600, multiple loss functions may be minimized. In one embodiment, a loss function for the autoencoder may be one of: $L_{autoencoder} = |X-X|_1$ or $|X-X|_2$ or $\rho(X, X)$ where $\rho$ is the Pearson correlation coefficient. In turn, a loss function for classifier 640 may be: $L_{classifier} = \text{binary\_crossentropy}(Y, y)$.

Note that these two resulting losses can be combined, e.g., according to a weighted sum, to perform a combined training. For example, a backpropagation can be performed for these multiple losses. In one embodiment, an independent backpropagation can be performed for each loss. In another case, a combined loss may be backpropagated. Resulting trained parameters, which may correspond to a network structure and weighted coefficients, may be stored in a non-transitory storage medium, both for use within a cloud-based destination as well as for providing, at least, an encoder of the autoencoder to one or more end node devices.

Also as discussed above, multiple trainings may be performed, where each training is for training an autoencoder (and classifier) for different information types, e.g., speech, image, video, etc.

Figure 7:
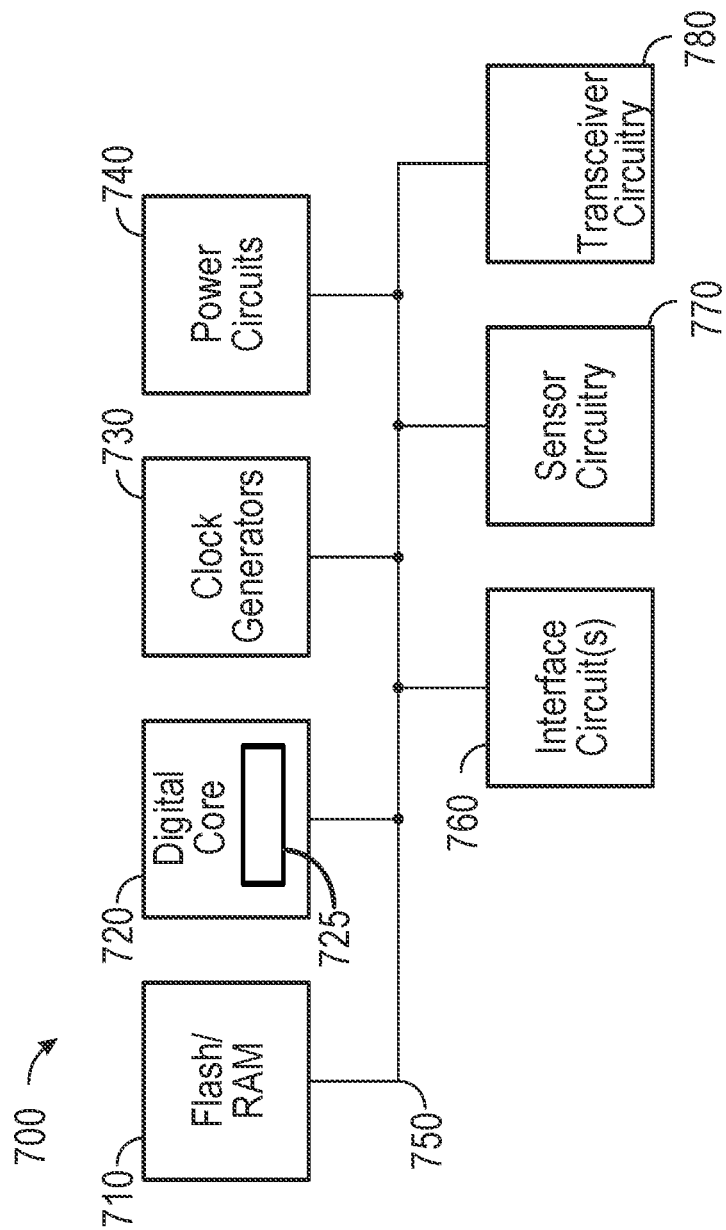
FIG. 7 is a block diagram of a representative device which may be incorporated into a wireless network as an end node in accordance with an embodiment.

Embodiments may be implemented in many different types of end node devices. Referring now to FIG. 7, shown is a block diagram of a representative device 700 which may be incorporated into a wireless network as a node. And as described herein, device 700 may perform compression, and communicate compressed spectrograms to a remote server, and in turn receive commands from the remote server. In the embodiment shown in FIG. 7, device 700 may be a sensor, actuator, controller or other device that can be used in a variety of use cases in a wireless control network, including sensing, metering, monitoring, embedded applications, communications applications and so forth.

In the embodiment shown, device 700 includes a memory system 710 which in an embodiment may include a non-volatile memory such as a flash memory and volatile storage, such as RAM. In an embodiment, this non-volatile memory may be implemented as a non-transitory storage medium that can store instructions and data. Such non-volatile memory may store code and data (e.g., trained parameters) for one or more autoencoders, as described herein, and may also store code performing methods including the methods of FIGS. 3 and 4.

Memory system 710 couples via a bus 750 to a digital core 720, which may include one or more cores and/or microcontrollers that act as a main processing unit of the device. As shown, digital core 720 includes a neural network 725 which may perform compression/decompression of spectrograms, as described herein. As further shown, digital core 720 may couple to clock generators 730 which may provide one or more phase locked loops or other clock generation circuitry to generate various clocks for use by circuitry of the device.

As further illustrated, device 700 further includes power circuitry 740, which may include one or more voltage regulators. Additional circuitry may optionally be present depending on particular implementation to provide various functionality and interaction with external devices. Such circuitry may include interface circuitry 760 which may provide interface with various off-chip devices, sensor circuitry 770 which may include various on-chip sensors including digital and analog sensors to sense desired signals, such as speech inputs, image inputs or so forth.

Figure 8:
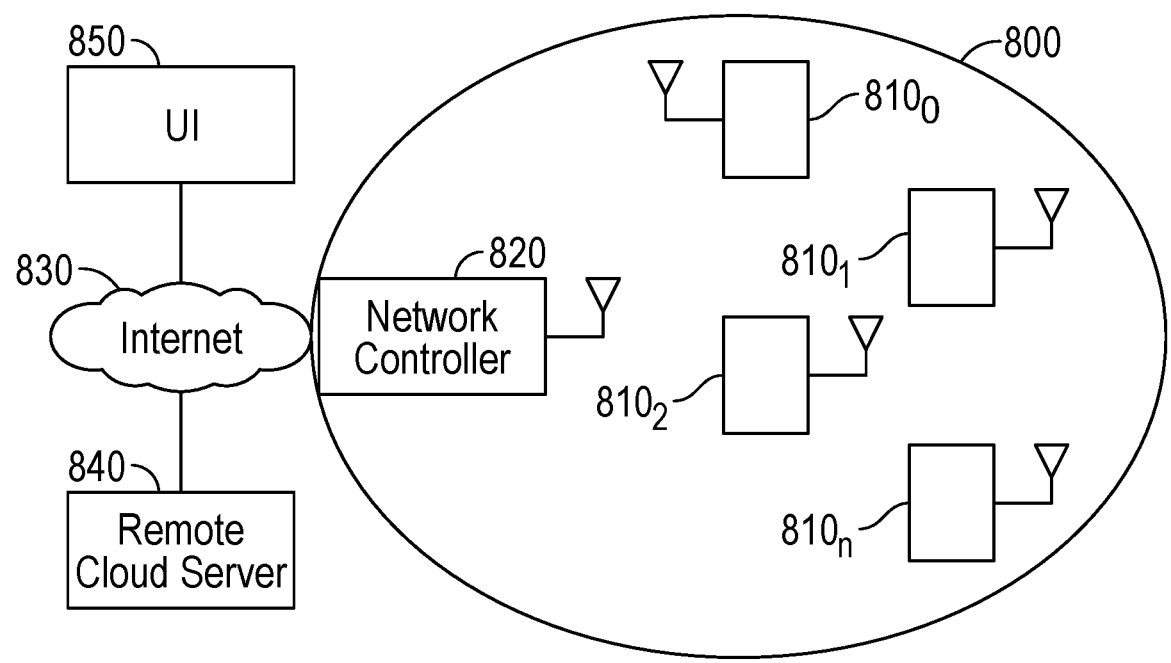
FIG. 8 is a block diagram of a representative wireless automation network in accordance with an embodiment.

In addition as shown in FIG. 7, transceiver circuitry 780 may be provided to enable transmission and receipt of wireless signals, e.g., according to one or more local area wireless communication schemes, such as Zigbee, Bluetooth, Z-Wave, Thread or so forth. Understand while shown with this high level view, many variations and alternatives are possible Referring now to FIG. 8, shown is a block diagram of a representative wireless automation network in accordance with an embodiment. As shown in FIG. 8, network 800 may be implemented as a mesh network in which various nodes 810 ($810_{0-n}$) communicate with each other and also may communicate messages along from a particular source node to a given destination node. Such message-based communication also may be realized between various nodes 810 and a network controller 820.

Understand while shown at a very high level in FIG. 8, network 800 may take many forms other than a mesh network. For example, in other cases a star network, a point-to-point network or other network topologies may be possible. Furthermore, while generic nodes 810 are shown for ease of illustration, understand that many different types of nodes may be present in a particular application. For example, in the context of a home automation system, nodes 810 may be of many different types. As examples, nodes 810 may include sensors, lighting components, door locks or other actuators, HVAC components, security components, window coverings, and possibly entertainment components, or other interface devices to enable control of such components via network 800. Of course in different implementations additional or different types of nodes may be present.

In addition, different nodes 810 may communicate according to different wireless communication protocols. As examples, representative communication protocols may include Bluetooth, Zigbee, Z-Wave, and Thread, among other possible wireless communication protocols. In some cases, certain nodes may be capable of communicating according to multiple communication protocols, while other nodes only may be capable of communicating by a given one of the protocols. Within network 800, certain nodes 810 may communicate with other nodes of the same communication protocol, either for providing direct message communication or for realizing mesh-based communications with network controller 820 or other components. In other instances, e.g., for certain Bluetooth devices, communications may be directly between a given node 810 and network controller 820.

As such in the embodiment of FIG. 8, network controller 820 may be implemented as a multi-protocol universal gateway. Network controller 820 may be the primary controller within the network and may be configured to perform operations to set up the network and enable communication between different nodes and update such set up as devices enter and leave network 800.

In addition, network controller 820 further may be an interface to interact with remote devices such as cloud-based devices. To this end, network controller 820 further may communicate, e.g., via the Internet with a remote cloud server 840. Remote cloud server 840 may include processors, memory and non-transitory storage media, which may be used to generate and pre-train an autoencoder and perform the other operations described herein. As also shown, one or more user interfaces 850 that can be used to interact with network 800 may be located remotely and may communicate with network controller 820 via the Internet 830. As examples, such user interfaces 850 may be implemented within a mobile device such as a smartphone, tablet computer or so forth of a user authorized to access network 800. For example, the user may be a homeowner of a home in which wireless network 800 is implemented as a home automation network. In other cases, the user may be an authorized employee such as an IT individual, a maintenance individual or so forth who uses remote user interface 850 to interact with network 800, e.g., in the context of a building automation network. Understand that many other types of automation networks, such as an industrial automation network, a smart city network, agricultural crop/livestock monitoring network, environmental monitoring network, store shelf label network, asset tracking network, or health monitoring network, among others also may leverage embodiments as described herein.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a sensor to sense real world information;
   a digitizer coupled to the sensor to digitize the real world information into digitized information;
   a signal processor coupled to the digitizer to process the digitized information into a spectrogram;
   a neural engine coupled to the signal processor, the neural engine comprising an autoencoder to compress the spectrogram into a compressed spectrogram; and
   a wireless circuit coupled to the neural engine to send the compressed spectrogram to a remote destination, to enable the remote destination to process the compressed spectrogram, wherein a decoder of the autoencoder is to decompress a first compressed spectrogram into a first reconstructed spectrogram, the first compressed spectrogram compressed by an encoder of the autoencoder from a first spectrogram, and the apparatus is to compare the first spectrogram to the first reconstructed spectrogram and send the first spectrogram to the remote destination instead of the first compressed spectrogram based at least in part on the comparison.

2. The apparatus of claim 1, wherein the neural engine is to store a model for the autoencoder, the model comprising a structure of a neural network and a plurality of coefficients, wherein the model comprises a pre-trained model generated using at least one correlation function according to a type of the real world information.

3. The apparatus of claim 2, wherein the apparatus is to receive an updated model from the remote destination and update at least some of the plurality of coefficients of the model based on the updated model.

4. The apparatus of claim 1, wherein the apparatus is to compare the first spectrogram to the first reconstructed spectrogram in response to a request from the remote destination.

5. The apparatus of claim 1, wherein the real world information comprises speech information, the apparatus comprising a voice-controlled end node device.

6. The apparatus of claim 5, wherein the voice-controlled end node device is to receive from the remote destination at least one command based at least in part on the compressed spectrogram.

7. The apparatus of claim 1, wherein the real world information comprises image information, the apparatus to take an action in response to a command from the remote destination based on detection at the remote destination of a person in the image information, based at least in part on the image information.

8. A voice-controlled device comprising:
   a microphone to receive a speech input;
   a digitizer coupled to the microphone to digitize the speech input into digitized information;
   a signal processor coupled to the digitizer to generate a spectrogram from the digitized information;
   a controller coupled to the signal processor, the controller comprising an encoder of an autoencoder to compress the spectrogram into a compressed spectrogram corresponding to the speech input; and
   a wireless circuit coupled to the controller to send the compressed spectrogram to a remote server to enable the remote server to process the compressed spectrogram, wherein in response to a command from the remote server, the controller is to cause the wireless circuit to send to the remote server an uncompressed spectrogram corresponding to another speech input.

9. The voice-controlled device of claim 8, wherein the controller further comprises a decoder of the autoencoder to decompress one or more compressed spectrograms compressed by the encoder of the autoencoder into one or more reconstructed spectrograms.

10. The voice-controlled device of claim 8, wherein the controller is to receive at least one second command from the remote server and effect a user-requested operation in response to the at least one second command, wherein the speech input comprises the user-requested operation.

11. The voice-controlled device of claim 8, further comprising a buffer to store a model for the encoder, the model comprising a structure of a neural network and a plurality of coefficient weights, wherein the model comprises a pre-trained model generated using at least one correlation function for the spectrogram.

12. The voice-controlled device of claim 11, further comprising a second buffer to store a second model for the encoder, the second model comprising a structure of a second neural network and a plurality of second coefficient weights, wherein the second model comprises a pre-trained model generated using at least one correlation function for an image input.

13. The voice-controlled device of claim 11, wherein the encoder is asymmetric from a decoder of the autoencoder, the decoder present at the remote server to decompress the compressed spectrogram, wherein the decoder has larger kernels and more filters than the encoder or a different architecture.

14. An apparatus comprising:
   at least one sensor to sense real world information;
   a digital core coupled to the at least one sensor, the digital core comprising:
      at least one microcontroller; and
      a neural network comprising:
         an encoder of an autoencoder to compress a spectrogram into a compressed spectrogram, the spectrogram corresponding to a speech input; and
   a transceiver coupled to the digital core to send the compressed spectrogram to a remote device, wherein in response to a command from the remote device, the transceiver is to send to the remote device an uncompressed spectrogram corresponding to another speech input.

15. The apparatus of claim 14, wherein the apparatus comprises an Internet of Things (IoT) device.

16. The apparatus of claim 15, wherein the IoT device comprises at least one of a sensor, an actuator, or a controller.

17. The apparatus of claim 14, further comprising further comprising memory to store a model for the encoder, the model comprising a structure of the neural network and a plurality of coefficient weights, wherein the model comprises a pre-trained model generated using at least one correlation function for the spectrogram.

18. The apparatus of claim 14, wherein the neural network further comprises a decoder of the autoencoder to decompress one or more compressed spectrograms into one or more reconstructed spectrograms.

* * * * *